United States Patent [19]

Douglas et al.

[11] Patent Number: 5,220,215

[45] Date of Patent: Jun. 15, 1993

[54] FIELD PROGRAMMABLE LOGIC ARRAY WITH TWO OR PLANES

[75] Inventors: Kurt P. Douglas; Paul S. Zagar, both of Boise, Id.

[73] Assignee: Micron Technology, Inc., Boise, Id.

[21] Appl. No.: 884,104

[22] Filed: May 15, 1992

[51] Int. Cl.⁵ .................................... H03K 19/177
[52] U.S. Cl. ........................ 307/465; 307/272.2
[58] Field of Search ...................... 307/465–469, 307/277.2

[56] References Cited

U.S. PATENT DOCUMENTS

| | | |
|---|---|---|
| 3,287,702 | 11/1966 | Borck, Jr. et al. |
| 3,287,703 | 11/1966 | Slotnick |
| 3,296,426 | 1/1967 | Ball |
| 3,313,926 | 4/1967 | Minnick |
| 3,423,646 | 1/1969 | Cubert et al. |
| 3,462,742 | 8/1969 | Miller et al. |
| 3,473,160 | 10/1969 | Wahestiom |
| 3,514,543 | 11/1970 | Crawford et al. ............... 340/324 |
| 3,535,498 | 10/1970 | Smith, Jr. |
| 3,566,153 | 2/1971 | Spencer, Jr. ...................... 307/468 |
| 3,602,733 | 8/1971 | Aoki ................................... 307/209 |
| 3,702,985 | 11/1972 | Probsting ...................... 340/166 R |
| 3,737,866 | 6/1973 | Gruner ............................. 340/172.5 |
| 3,742,242 | 2/1974 | Preel .................................. 307/209 |
| 3,757,306 | 9/1973 | Boone .............................. 340/172.5 |
| 3,769,525 | 10/1973 | Foss et al. ......................... 307/254 |
| 3,774,171 | 11/1973 | Regetz .............................. 365/105 |
| 3,795,901 | 3/1974 | Boehm et al. ................... 340/172.5 |
| 3,798,606 | 3/1974 | Henle et al. ..................... 340/172.5 |
| 3,803,587 | 4/1974 | Mead ................................ 340/336 |
| 3,816,725 | 6/1974 | Greir ................................ 364/716 |
| 3,818,252 | 6/1974 | Chiba et al. ..................... 307/303 |
| 3,818,452 | 6/1974 | Greer .............................. 340/825.83 |
| 3,832,489 | 8/1974 | Krishna ............................. 178/71 |
| 3,849,638 | 11/1974 | Greer ................................ 364/716 |
| 3,906,255 | 9/1975 | Mensch, Jr. .................... 307/448 |
| 3,912,947 | 10/1975 | Buchanan ........................ 307/269 |
| 3,924,243 | 12/1975 | Vermeulen ....................... 364/900 |
| 3,967,059 | 6/1976 | Moore, III et al. ................ 178/58 |
| 3,974,366 | 8/1976 | Hebenstreit ....................... 364/716 |
| 3,979,730 | 9/1976 | Bennett et al. ................... 364/200 |
| 3,983,538 | 9/1976 | Jones ................................ 364/716 |
| 3,987,286 | 10/1976 | Hornlager ......................... 235/152 |
| 3,987,410 | 10/1976 | Beausoleil et al. ............... 340/146.3 |
| 3,990,045 | 11/1976 | Beausoleil et al. ............... 340/146.3 |
| 4,034,349 | 7/1977 | Monaco et al. .................. 364/200 |
| 4,034,356 | 7/1977 | Howley et al. ................... 340/173 |
| 4,037,087 | 7/1977 | Muhldorf ......................... 235/152 |
| 4,037,089 | 7/1977 | Horninger ........................ 235/152 |
| 4,044,312 | 8/1977 | O'Ortenzio ...................... 328/165 |
| 4,078,259 | 3/1978 | Soulsby et al. .................. 364/900 |
| 4,091,359 | 5/1978 | Rossler ........................... 340/166 R |
| 4,093,998 | 6/1978 | Miller .............................. 364/900 |
| 4,107,785 | 8/1978 | Seipp ............................... 364/900 |
| 4,124,899 | 11/1978 | Berliner et al. |
| 4,128,873 | 12/1978 | Lamlaux .......................... 364/200 |
| 4,218,740 | 8/1980 | Bennett et al. ................... 364/200 |
| 4,422,072 | 12/1983 | Cavlan ........................... 340/825.87 |
| 4,554,640 | 11/1985 | Wong et al. ...................... 364/716 |
| 4,717,912 | 1/1988 | Harvey et al. .................. 340/825.87 |
| 4,758,746 | 7/1988 | Birkner ............................. 307/465 |
| 4,763,020 | 8/1988 | Takata et al. ..................... 307/465 |

(List continued on next page.)

FOREIGN PATENT DOCUMENTS 1444084 7/1976 United Kingdom .

OTHER PUBLICATIONS

"CMOS EPLD and Gate Arrays" ATMEL High Density UV Erasable Programmable Logic Device, pp. 19+24+20.

J. E. Elliott, et al., "Array Logic Processing", IBM Tech. Disclosure Bulletin, vol. 18, No. 21, Jul. '73, pp. 219 & 220.

(List continued on next page.)

*Primary Examiner*—David R. Hudspeth
*Attorney, Agent, or Firm*—Michael W. Starkweather

[57] ABSTRACT

A programmable logic device (PLD) is disclosed which can efficiently, in a real estate sense, emulate a Mealy state machine. Specifically, there is a PLD which has: (1) a programmable logical AND and two programmable logical OR arrays, similar to a field programmable logic array; and (2) one of the two fully programmable OR array generates a next state of the circuit and the second OR array generates an output responsive to both the inputs and the current state.

8 Claims, 5 Drawing Sheets

U.S. PATENT DOCUMENTS

| | | | |
|---|---|---|---|
| 4,771,285 | 9/1988 | Agrawal et al. | 340/825.83 |
| 4,847,612 | 7/1989 | Kaplinsky | 340/825.8 |
| 4,967,107 | 10/1990 | Kaplinsky | 307/465 |
| 5,012,135 | 4/1991 | Kaplinsky | 307/465 |
| 5,028,821 | 7/1991 | Kaplinsky | 307/465 |

OTHER PUBLICATIONS

H. Fleisher, et al., "Reconfigurable Machine", IBM Tech. Disclosure Bulletin, vol. 16 No. 10 Mar. 1974, pp. 221, 222 & 223.

W. Carr et al, Mos/LSI Design and Applications pp. 229–258.

H. Fleisher et al, "An Introduction to Array Logic" IBM J. Research & Development, Mar. 1975 pp. 98–104.

Jones, "Array Logic Macros" IBM J. Research and Development, Mar. 1975 pp. 120–126.

Andres, "MOS Programmable Logic Arrays" A Texas Instrument Application Report Oct. 1970 pp. 1–13.

Barna et al, Integrated Circuits in Digital Electronics John Wiley & Sons 1973, pp. 412–419 and 84–91 and FIGS. 11–34.

Wood "High Speed Dynamic Programmable Logic Array Chip" IBM J. Res. Develop. Jul. 1975, pp. 379–381.

Boysel, "Memory on a Chip: A Step Toward Large-Scale Integration" Electronics, Feb. 6, 1967 pp. 93–97.

Wilkes et al "The design of the Control Unit of an Electronic Digital Computer" The Institution of Electrical Engineers, Jun. 1957, pp. 121–128.

Mrazek, "PLAs Replace ROMs for Logic Designs" Electronic Design Oct. 25, 1973 pp. 66–70.

Howley et al. "Programmable Logic Array Decoding Technique" IBM Tech. Disclosure Bulletin, vol. 17, No. 10 Mar. 1975—p. 2988.

Hemel "The PLA: A Different Land of ROM" Electronic Design, Jan. 5, '76 pp. 78–84.

Calvan et al. "FPLA Applications—Exploring Design Problems and Solutions" pp. 63–69 source and data n/a.

Kidder, The Soul of a New Machine, 1982 pp. 118–128 and 268–269.

National Semiconductor Inc. "Data update MOS" Aug. 1972, pp. 86 and 87.

Blakeslee, Digital Design with Standard MSI and LSI, John Wiley and Sons, 1975, pp. 67–77, 94–99, and 104–105.

PAL Handbook, Monolithic Memones, Inc. 1978 p. N/A.

Hutton et al. "A Simplified Summation/Array for Cellular Logic Molecules" IEEE Trans. On Computers, Feb. 1974 pp. 203–206.

Programmable Logic—A Basic Guide for the Designer, Data I/O Corp. 1983—pp. 20–25.

The TTL Data Book for Design Engineers, Texas Instruments Inc, 1973, pp. 295–303, 473, 458 and 480.

Ramaswamy et al "Second Generation PAL Programmars" Wescon/83 Professional Program Session Record, Session 13.

Monolithic Memones Inc. Form 10-K, Oct. 3, 1982 Annual Report Pursuant to Section 13 or 15(2) of the Securities Exchange Act of 1934.

"The Role of Software in the Growth of PLDs" The Technology Research Group Letter, vol. 1, No. 13, Nov. 1985 p. 3.

Teil et al. "A Logic Memones for KLSI PLA Design" ACM IEEE Ninteenth Design Automation Conf. Proceedings, Jun. 82, pp. 156–162.

Marrin, "Programmable Logic Devices Gain Software Support" EDN Feb. 9, 1984, pp. 67–74.

Cole et al. "Next Generation Programmable Logic" Wescon/84 Professional Program Session Record, Session 19.

Monolithic Memones Annual Report 1981, Letter to Shareholders p. 2.

"Semicustom IC Update, Field Programmable Logic Devices" Visa from the Valley, Hambrecht & Just Inc. vol. 3 No. 1, Mar. 86 pp. 4–7.

Phelps, Institutional Research Report on Monolithic Memones, Inc., A publication of Woodman, Kirkpatrick & Gilbrath Aug. 30, '84.

Wood, "High-Speed Dynamic Programmable Logic Array Chip" IBM J. Res. Develop. Jul. 1975, pp. 379–381.

Cavlan et al "Field PLAS Simplify Logic Designs" reprinted from Electronic Design, Sep. 1, 1975.

Signetics Bipolar and MOS Memory, Data Manual Signetics Inc, pp. 156–165 Jan. 1979.

Dorman "PLAS on MPs at Times they Compete at Time they Cooperate" Electronic Design, 18 Sep. 1, 1976, pp. 24–30.

Elliot et al "Array Logic Processing" IBM Tech. Disclosure Bulletin, vol. 16 No. 2 Jul. 1973 pp. 586–587.

MacWorld, The Macintosh Magazine, May—Jun. 1984. "Programmable Logic Arrays" MOS/LSI Design and Application, p. 102.

H. Fleisher et al "An Introduction to Array Logic" IBM J. Res. Development, p. 132.

"User—Programmable Logic Devices add Eraciability and Hit New Density Levels, Electronic Products, p. 276.

Use of Laser Mechanism in Printers breaks Prue and Maintenance Barriers, Jan. 15, '85 p. 277.

FIELD PROGRAMMABLE LOGIC ARRAY WITH TWO OR PLANES

CROSS-REFERENCE TO RELATED AND COPENDING APPLICATIONS

U.S. patent application Ser. No. 07/817,167, filed Jan. 6, 1992, is a CMOS logic cell for high-speed, zero-power programmable array logic devices, having common assignee with the present invention.

U.S. patent application Ser. No. 07/865,007, filed Apr. 8, 1992, is a field programmable logic array with speed optimized architecture, having common assignee with the present invention.

U.S. patent application No. 883,759, filed May 5, 1992, is a programmable logic device with a single parameter state decode, having common assignee with the present invention.

U.S. patent application No. 884,489, filed May 5, 1992, is a programmable logic device macrocell with two or array inputs, having common assignee with the present invention.

U.S. patent application No. 883,076, filed May 5, 1992, is a programmable logic device macrocell with an exclusive feedback line and an exclusive external input line, having common assignee with the present invention.

U.S. patent application No. 884,505, filed May 5, 1992, is a programmable logic device macrocell with an exclusive feedback line and an exclusive external input line for a combinatorial mode and accommodating two separate programmable or planes, having common assignee with the present invention.

U.S. patent application No. 883,843, filed May 5, 1992, is a programmable logic device macrocell with an exclusive feedback line and an exclusive external input line for a state counter or registered sum-of-products signal, having common assignee with the present invention.

U.S. patent application No. 883,078, filed May 5, 1992, is a programmable logic device macrocell with an exclusive feedback line and an exclusive external input line for registered and combinatorial modes using a dedicated product term for control, having common assignee with the present invention. U.S. patent application Ser. No. 884,104, filed May 5, 1992, is a field programmable logic array with two OR planes, having common assigned with the present invention.

FIELD OF THE INVENTION

This invention relates to field programmable logic arrays (FPLA); particularly, an FPLA having two fully programmable OR arrays utilized for creating efficient Mealy machine architecture.

BACKGROUND OF THE INVENTION

The introduction of programmable logic devices (PLD) was a true revolution in the hardware design world. It enabled engineers to shrink circuits requiring several devices onto a single device thus simplifying their designs while saving space and power. Traditionally, PLDs have been used in combinational circuits such as address decoders as well as sequential circuits such as bus arbitration schemes. During the last few years, advances and improvements in PLD architectures enabled the devices to grow more complex while addressing the never-ending quest for higher density and faster speeds. Despite these improvements, engineers still face certain problems and limitations when implementing state machine designs with PLDSs.

A typical programmable logic device is composed of a user-programmable AND array, a fixed OR gate, followed by an output register which includes a feedback path from the output to the programmable AND array. Combination of these elements is commonly referred to as a 'macrocell.' The existence of a feedback path from the output registers to the AND array makes PLDs ideal candidates for state machine implementations.

There are several basic categories of state machines such as Mealy and Moore machines. FIG. 1 illustrates the basics of a Mealy state machine as follows: a logic circuit 10, inputs 12 from the outside world, next state inputs 14, outputs 16, and outputs 18 leading to flip-flops 20.

The main characteristic of the Mealy is that its outputs 16, to the outside world, are a function of both inputs 12 and inputs 14. Inputs 14 couple the present state of the machine from flip-flops 20.

It is possible to implement any of the state machines in a PLD; however, there are inefficiencies in implementing state machines with current PLDs.

FIG. 2 illustrates that if a Mealy machine is implemented on a standard PLD, a wasteful two macrocells would be required—one per state register and one for each output. In operation, inputs 28, lead to both logic circuit 30 and 40, comprising an AND and OR matrix. Logic circuit 30 generates the next state then outputs to flipflops 32, working as memory elements. The outputs of register 32 is the current state, which is input to logic circuits 30 and 40. Logic circuit 40 has the current state and inputs 28 as inputs for decoding and then outputting over pads 44.

Inefficiencies occur in that pads 34 are by-passed and not used and that flip-flops 42 are likewise by-passed and not used. Specifically, both macrocell 33 and 43 are under-utilized.

The use of an extra macrocell is not an efficient use of the device resources and is fairly limiting in application. For example, generally a Mealy state machine with four outputs would be constrained to having no more than four state variables in an eight macrocell PLD.

Therefore, a need exists for an IC which has more efficient use of the macrocells, and specifically, the output pads and registers/flip-flops.

SUMMARY OF THE INVENTION

The present invention provides an IC which implements a Mealy state machine with efficient use of its output pads and flip-flops. Specifically, the present invention discloses the utilization of two programmable OR arrays which share common output pads. Furthermore, a first OR array feeds into the memory elements or flip-flops needed for a Mealy state machine, and the second OR array processes the inputs and current state wherein these signals are fed into the output buffer.

Features of the present invention will become clear from the following detailed description of the invention, taken in conjunction with the accompanying drawings.

DETAILED DESCRIPTION OF THE ILLUSTRATED EMBODIMENT

Incorporated Material

For the purpose of providing background material which may in some respects illustrate the state of the art, the following books are herein incorporated by reference: "Programmable Logic Handbook," fourth edition, by Monolithic Memories Inc., 2175 Mission College Blvd., Santa Clara, Calif.; and "Practical Design Using Programmable Logic," by D. Pellerin and M. Holley, Prentice Hall, library of Congress no. TK7872 .L64 P44 1991.

The following U.S. patents are herein incorporated by reference: U.S. Pat. No. 3,423,646, is a computer logic device consisting of an array of tunneling diodes, isolators and short circuits. U.S. Pat. No. 3,566,153, is a programmable sequential logic device. U.S. Pat. No. 4,124,899, is a programmable array logic circuit. U.S. Pat. No. 4,717,912, an apparatus for producing any one of a plurality of signals at a single output. U.S. Pat. No. 4,758,746, is a programmable logic array with added array of gates and added output routing flexibility.

DEFINITIONS

It is noted that in the following discussions, the term 'array' is often used as referring to groupings or divisions of logical OR gates. Although, technically, these groupings taken together form a single logical OR array. Additionally, flip-flops are also referred to as registers, latches, or memory elements. When referring to or illustrating output pads, drivers or buffers are inherently included, although not always stated or illustrated.

Broad Concept

Figure 1:
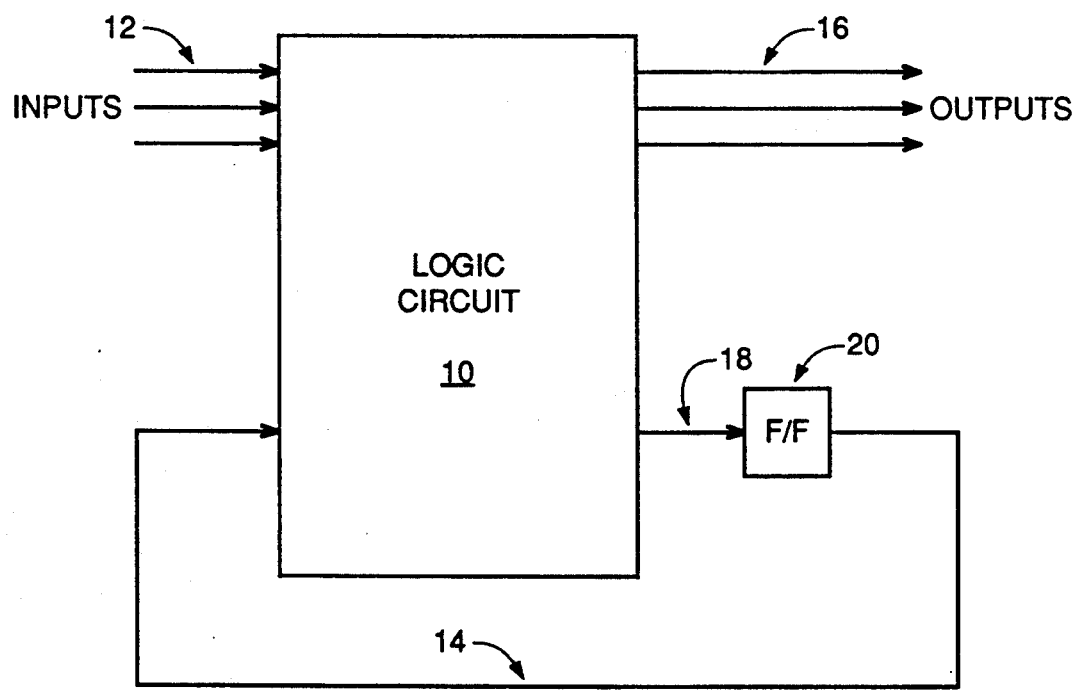
FIG. 1 is a block diagram illustrating the function/logic of a Mealy state machine.
Figure 2:
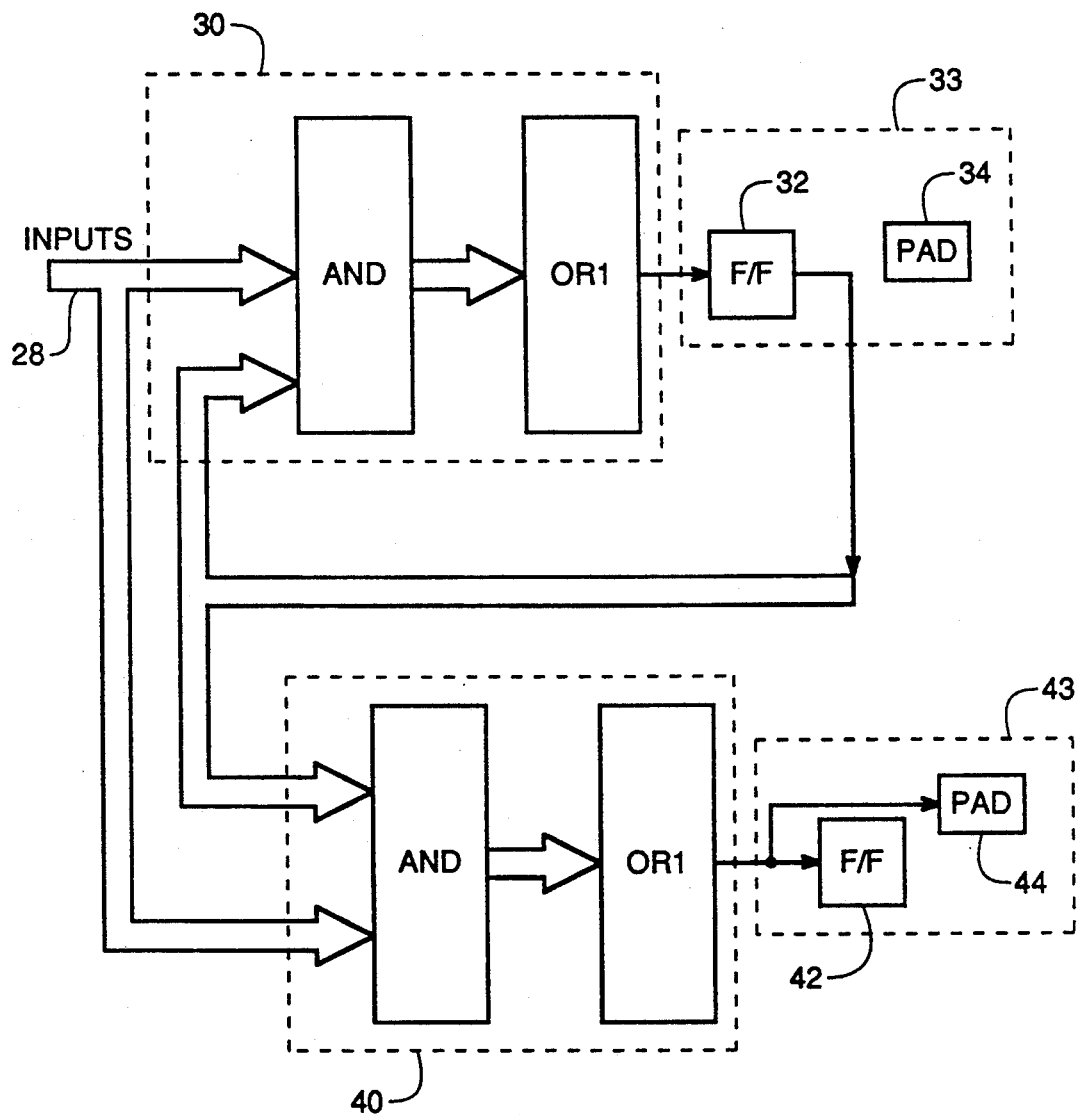
FIG. 2 is a block diagram of a Mealy machine implemented on a typical PLD.
Figure 3:
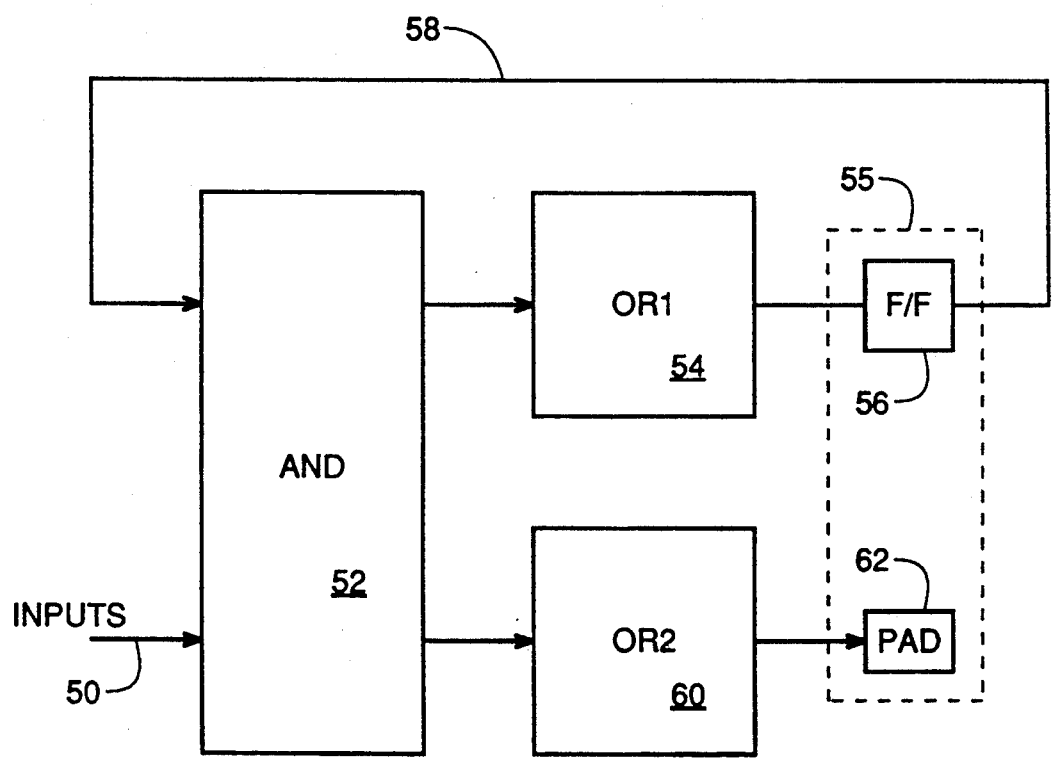
FIG. 3 illustrates a block diagram implementing a Mealy state machine by the disclosed invention.

FIG. 3 is a block diagram of the preferred invention when utilized as a Mealy state machine, and having the following elements: input 50, programmable logical AND array 52, a first programmable logical OR array 54, macrocell 55 having flip-flop 56 and output pad 62, feedback line 58, and a second logical OR array 60.

One skilled in the art will appreciate the advantage of this architecture. Specifically, by implementing two OR arrays, which have a common macrocell, the first OR will calculate the next state of the Mealy machine, and the second OR will calculate the outputs in response to the current state and the inputs. Thus, a Mealy state machine is implemented with more efficient use of the macrocells than was possible in the prior art PLD's.

Specific Embodiment

Figure 4:
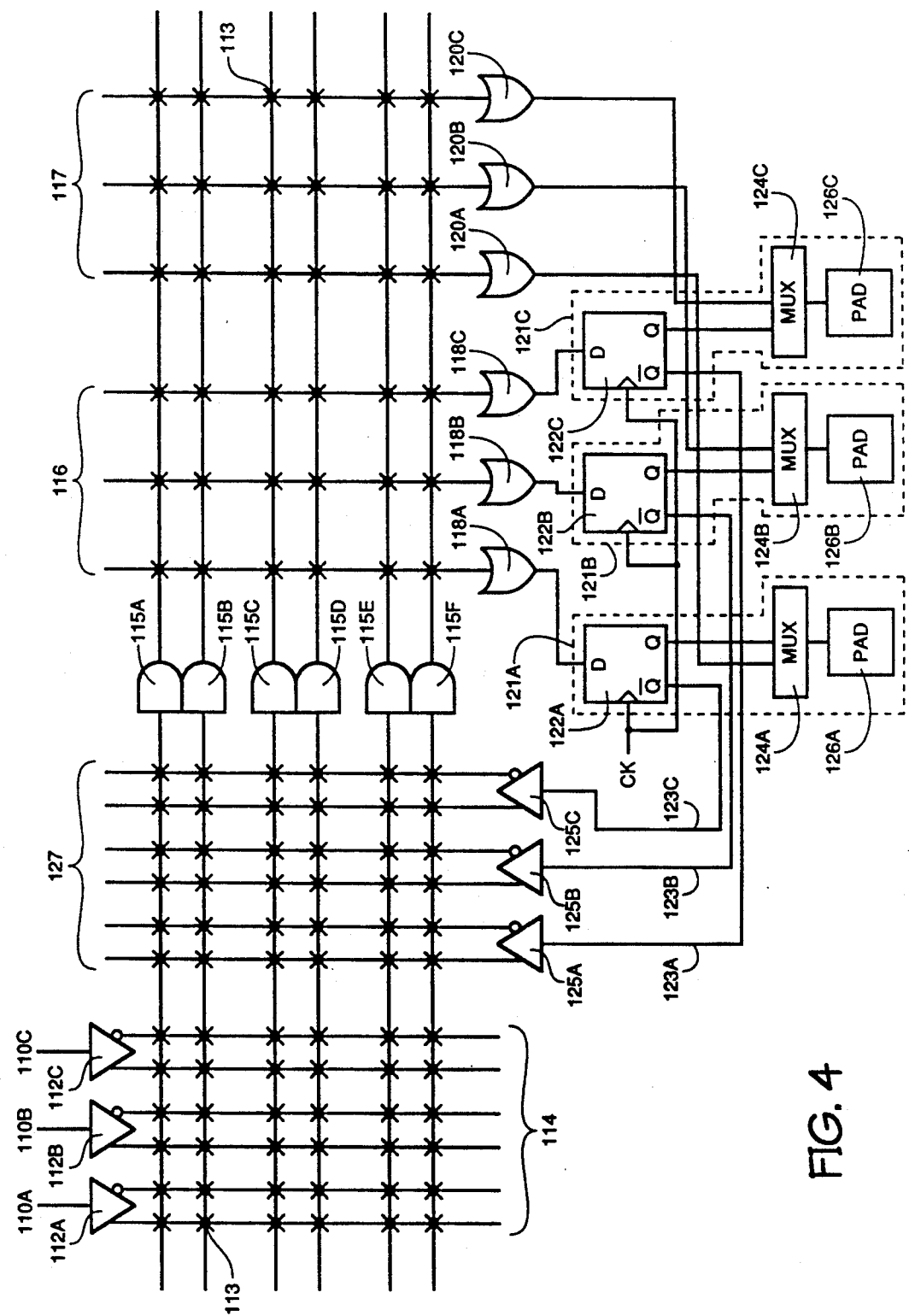
FIG. 4 is a detailed illustration of a small portion of the disclosed invention.

FIG. 4 is a detailed and expanded illustration of the broad invention of FIG. 3. The following description is a rough comparison of FIG. 3 and FIG. 4, rough in that FIG. 3 illustrates a single path utilizing one macrocell, yet FIG. 4 is illustrative of larger arrays and more macrocells.

In reference to and comparison of FIGS. 3 and 4 there is the following: Inputs 50 (from FIG. 3) compares to input lines 110A-C (from FIG. 4). Programmable AND array 52 compares to programmable matrix 114 and 127, programmable cells typified by 113, buffers 112A-C and 125A-C and logical AND gates 115A-F. First programmable OR array 54 compares to programmable matrix 116, and logical OR gates 118A-C. Second programmable OR array 60 compares to programmable matrix 117, and logical OR gates 120A-C. Single macrocell 55 is illustrative of one of the macrocells 121A-C, which in turn respectively comprise flop-flops 122A-C, multiplexers 124A-C, and output pads 126A-C. State signal feedback line 58 compares to feedback lines 123A-C.

One skilled in the art will notice the efficiencies of the described embodiment upon emulating the desired Mealy machine. Specifically, the first OR array which calculates the next state is not necessarily connected to its own output pad. Additionally, the second OR array which calculates the output signal does not feed into an unused flip-flop or memory element. Therefore, there is a field programmable logic device which is efficiently designed to emulate a Mealy state machine.

Figure 5:
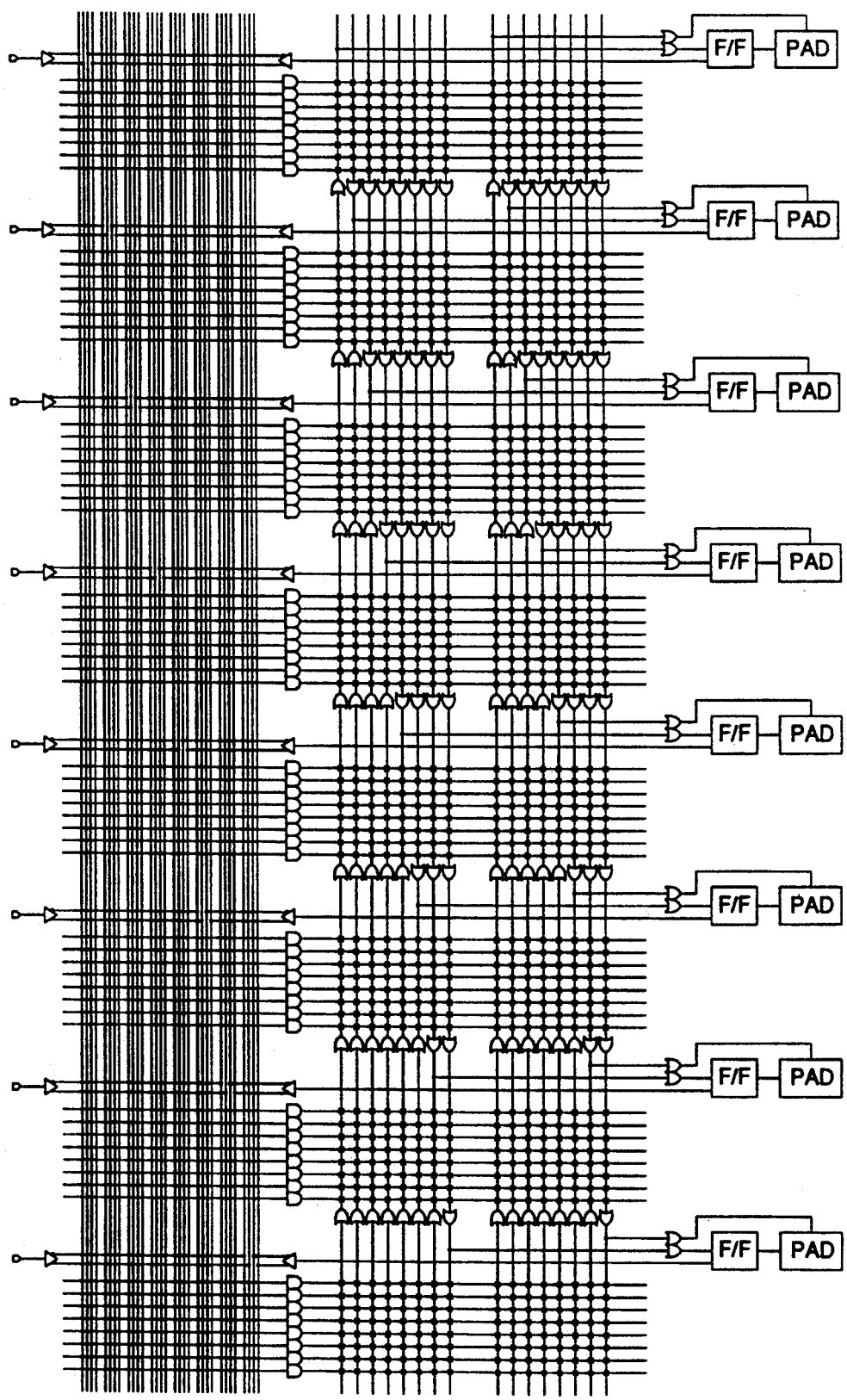
FIG. 5 is a large scale detailed embodiment of the disclosed invention.

FIG. 5 is illustrative of one designed embodiment of the subject invention.

Variations in the Invention

There are several obvious variations to the broad invention and thus come within the scope of the present invention. Variations occur by providing larger AND and OR arrays, ie. having a 32 × 64 AND array and a 64 × 8 OR array.

It is noted that the OR arrays are preferred to be designed using either arrays or static logic, depending upon a specific application for the invention, or the size of the array needed.

It will be readily apparent that any compatible logic, ie, AND, OR, NAND, NOR, may be utilized.

While the invention has been taught with specific reference to one embodiment, someone skilled in the art will recognize that changes can be made in form and detail without departing from the spirit and the scope of the invention.

Although subheadings in the Detailed Description of the Illustrated Embodiment are used, these are merely provided for assisting the reader; wherein, the writer is free to enter any information under any heading/s.

We claim:

1. An integrated circuit, comprising:
   (a) a plurality of circuit input lines;
   (b) a plurality of logical AND gates (115A-F);
   (c) a first programmable matrix, coupling said plurality of input lines to the inputs of said plurality of logical AND gates;
   (d) a first plurality of logical OR gates (118A-C);
   (e) a second programmable matrix, coupling the outputs of said plurality of logical AND gates to the inputs of said first plurality of logical OR gates;
   (f) a second plurality of logical OR gates (120A-C) having inputs coupled to the outputs of said plurality of logical AND gates; and
   (g) a plurality of memory elements exclusively coupled to said first plurality of OR gates.

2. An integrated circuit as in claim 1, further comprising:
   a plurality of output pads (126A-C) having inputs from said first and second OR arrays.

3. A programmable logic device, comprising:

(a) a plurality of circuit input lines;
(b) a plurality of logical AND gates;
(c) a first matrix array coupling input liens to the inputs of said plurality of logical AND gates;
(d) a first plurality of logical OR gates;
(e) a second matrix array coupling the outputs of said plurality of logical AND gates to the inputs of said first plurality of logical OR gates;
(f) a second plurality of logical OR gates, having inputs coupled to the outputs of said plurality of logical AND gates; and
(g) a plurality of memory elements exclusively coupled to said first plurality of logical OR gates.

4. A programmable logic device as in claim 3, wherein:
said first matrix is programmable.

5. A programmable logic device as in claim 3, wherein:
said second matrix is programmable.

6. An integrated circuit, comprising:
(a) a programmable logic device (PLD) having a plurality of logical AND gates and a first and second plurality of logical OR gates;
(b) said PLD having two signal paths for the inputs to the outputs of said PLD, where the first signal path exclusively utilizes the first plurality of logical OR gates and a memory element, and the second signal path exclusively utilizes the second plurality of logical OR gates and does not utilize a memory element.

7. An integrated circuit as in claim 6 wherein said first and second signal paths share common output pads.

8. An integrated circuit, comprising:
(a) a programmable logic device (PLD) having a plurality of logical AND gates, a first logical OR gate, a second logical OR gates, a latch receiving signals exclusively from the first OR gate, the OR gates receiving signals form the AND gates;
(b) an outputting means for outputting a latched or non-latched signal, wherein said latched signal is exclusively from said latch and said non-latched signal originates exclusively from said second logical OR; and
(c) said latched and non-latched signals are outputted over a common output pad.

* * * * *